(12) United States Patent
Xiao

(10) Patent No.: US 11,742,360 B2
(45) Date of Patent: Aug. 29, 2023

(54) GATE DRIVER ON ARRAY (GOA) SUBSTRATE, METHOD FOR FABRICATING SAME, AND DISPLAY DEVICE COMPRISING SAME

(71) Applicant: SHENZHEN CHINA STAR OPTOELECTRONICS SEMICONDUCTOR DISPLAY TECHNOLOGY CO., LTD., Shenzhen (CN)

(72) Inventor: Bangqing Xiao, Shenzhen (CN)

(*) Notice: Subject to any disclaimer, the term of this patent is extended or adjusted under 35 U.S.C. 154(b) by 359 days.

(21) Appl. No.: 16/766,711

(22) PCT Filed: May 9, 2020

(86) PCT No.: PCT/CN2020/089472
§ 371 (c)(1),
(2) Date: May 25, 2020

(87) PCT Pub. No.: WO2021/212559
PCT Pub. Date: Oct. 28, 2021

(65) Prior Publication Data
US 2022/0123029 A1    Apr. 21, 2022

(30) Foreign Application Priority Data
Apr. 23, 2020   (CN) .................. 202010328508.X

(51) Int. Cl.
*H01L 27/12*     (2006.01)
*G02F 1/1362*     (2006.01)
*G02F 1/1368*     (2006.01)

(52) U.S. Cl.
CPC ........ *H01L 27/1244* (2013.01); *G02F 1/1368* (2013.01); *G02F 1/136236* (2021.01); *G02F 1/136286* (2013.01); *H01L 27/1288* (2013.01)

(58) Field of Classification Search
CPC ............ H01L 27/1288; H01L 27/1244; G02F 1/1368; G02F 1/136236; G02F 1/136286;
(Continued)

(56) References Cited

U.S. PATENT DOCUMENTS

2005/0260780 A1*   11/2005   Ahn ................... G02F 1/136213
                                                                                 257/E27.113
2008/0122767 A1*   5/2008   Lim ................... G02F 1/134363
                                                                                345/87

(Continued)

FOREIGN PATENT DOCUMENTS

CN           1121619 A       5/1996
CN         101661198 A       3/2010
(Continued)

*Primary Examiner* — Hoan C Nguyen

(57) ABSTRACT

A gate driver on array (GOA) array substrate, a method for fabricating the same, and a display device including the same, which include a GOA driving circuit. The GOA driving circuit includes a plurality of GOA units. Each of the GOA units includes a thin film transistor array layer, a first metal layer, an insulating layer, and a second metal layer. The first metal layer has a patterned signal line at a position crossing the second metal layer. The signal line includes a trunk portion and side walls formed of two opposite sides of the trunk portion. The side walls are shaped as arc-shaped grooves.

13 Claims, 1 Drawing Sheet

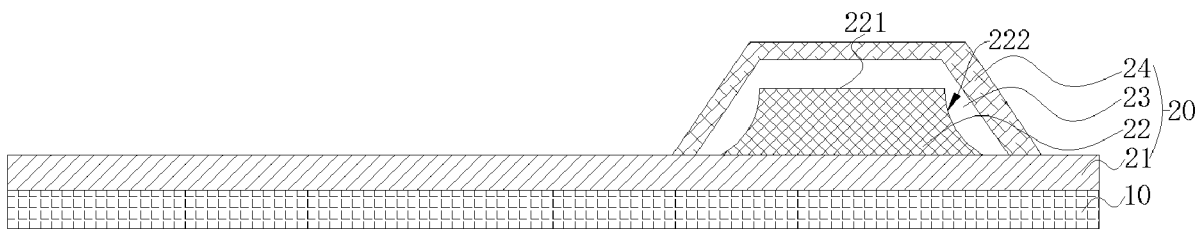

(58) Field of Classification Search
CPC ......... G02F 1/133345; G02F 1/136213; G02F 1/13454; G02F 1/13452; G02F 1/13606; G02F 1/1343; G02F 2201/12; G02F 1/1357; G02F 1/1676; G09G 3/3655; G09G 2300/0842; G09G 2300/0852
See application file for complete search history.

(56) References Cited

U.S. PATENT DOCUMENTS

| | | | | |
|---|---|---|---|---|
| 2009/0250701 A1* | 10/2009 | Kimura | ............. | H01L 29/78675 257/E33.053 |
| 2010/0258806 A1* | 10/2010 | Nakayama | .......... | H01L 29/7869 257/E21.414 |
| 2018/0231854 A1* | 8/2018 | Miyazaki | .......... | G02F 1/134309 |

FOREIGN PATENT DOCUMENTS

| | | | | |
|---|---|---|---|---|
| CN | 109411411 A | | 3/2019 | |
| JP | 2002341367 A | * | 11/2002 | ......... G02F 1/13458 |
| JP | 2017097053 A | | 6/2017 | |
| TW | 201041145 A | | 11/2010 | |
| TW | 201407739 A | | 2/2014 | |

* cited by examiner

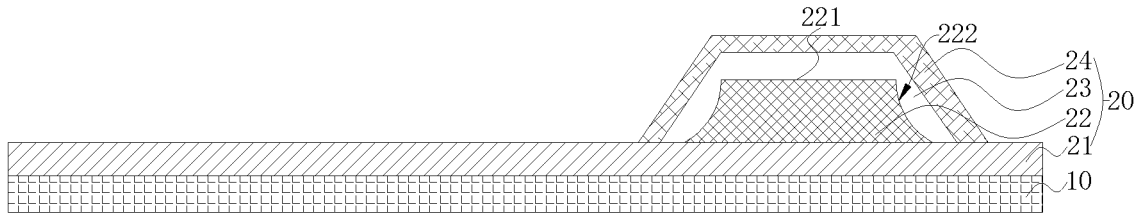

FIG. 1

```
┌─────────────────────────────────────────────────┐
│ Forming a first metal layer on a GOA driving circuit area of a │
│ base substrate, wherein the first metal layer has a patterned │
│ signal line at a cross-line position of the GOA driving circuit │──S10
│ area, and the signal line comprises a trunk portion and side │
│ walls formed of two opposite sides of the trunk portion. │
└─────────────────────────────────────────────────┘
                          │
┌─────────────────────────────────────────────────┐
│ Etching the side walls by a half-tone mask and a │──S20
│ photolithography pattern process to form arc-shaped grooves │
└─────────────────────────────────────────────────┘
                          │
┌─────────────────────────────────────────────────┐
│ Forming an insulating layer on the first metal layer, wherein │──S30
│ the insulating layer fills the arc-shaped grooves │
└─────────────────────────────────────────────────┘
                          │
┌─────────────────────────────────────────────────┐
│ Forming a second metal layer on the insulating layer │──S40
└─────────────────────────────────────────────────┘
```

FIG. 2

GATE DRIVER ON ARRAY (GOA) SUBSTRATE, METHOD FOR FABRICATING SAME, AND DISPLAY DEVICE COMPRISING SAME

FIELD OF INVENTION

The present disclosure relates to the technical field of display, and particularly to a gate driver on array (GOA) array substrate, a method for fabricating the same, and a display device comprising the same.

BACKGROUND

With continuous development of liquid crystal display panel technology, gate driver on array (GOA) technology is widely used in circuit designs of liquid crystal display panels. Therefore, more and more related circuit traces are also integrated on the panels. In the GOA technology, a gate driving circuit is formed on an array substrate by using a current thin film transistor liquid crystal display (TFT-LCD) array process, so as to realize progressive scanning of gate lines. The GOA technology can conserve gates IC, which facilitates design of a narrow frame on a gate driver of a display screen and reduces cost. As a result, it is widely used and researched.

In a design of bus lines of a current GOA array substrate, a clock signal driven by GOA will be introduced from the bus lines to a GOA unit by crossing lines. At a position where the lines cross in the GOA unit, a first metal layer (M1) easily forms a taper angle during deposition, so that a deposition thickness of an insulating layer is uneven and thinner than a deposition thickness of the insulating layer in a horizontal position. When the clock signal (CK) is a high-frequency signal, heat is easily generated between the first metal layer (M1) and the second metal layer (M2), and capacitance between the first metal layer (M1) and the second metal layer (M2) easily breaks down the insulating layer, causing a short circuit between signals. This will trigger overcurrent protection of a display panel, resulting in a black screen on the display panel. Therefore, how to improve probability of a short circuit between the first metal layer (M1) and the second metal layer (M2) at a position where signal lines cross in a GOA bus line area of the GOA array substrate is a problem that needs to be solved urgently.

When a clock signal (CK) at a position where the lines cross in the GOA unit of the GOA array substrate has a high-frequency signal, heat is easily generated between the first metal layer (M1) and the second metal layer (M2), and capacitance between the first metal layer (M1) and the second metal layer (M2) easily breaks down the insulating layer, causing a short circuit between signals. This will trigger overcurrent protection of a display panel, resulting in a black screen on the display panel.

SUMMARY OF DISCLOSURE

The present disclosure provides a gate driver on array (GOA) array substrate, a method for fabricating the same, and a display device comprising the same, which can effectively reduce a risk of short circuit between a first metal layer (M1) and a second metal layer (M2) at a position where signal lines cross in a GOA bus line area, thereby improving stability of a GOA drive circuit. Those solve the technical problem that, in a current GOA array substrate or in a method for fabricating the same, a first metal layer (M1) and a second metal layer (M2) of a GOA unit are prone to short circuit, triggering overcurrent protection, and then causing a black screen of a display device.

The present disclosure provides a gate driver on array (GOA) array substrate comprising a base substrate and a GOA driving circuit. The GOA driving circuit is disposed on the base substrate and comprises a plurality of GOA units connected to each other. Each of the GOA units comprises a thin film transistor array layer, a first metal layer disposed on the thin film transistor array layer, an insulating layer disposed on the first metal layer, and a second metal layer disposed on the insulating layer. The first metal layer has a patterned signal line at a position crossing the second metal layer. The signal line comprises a trunk portion and side walls formed of two opposite sides of the trunk portion. The side walls are shaped as arc-shaped grooves.

In the GOA array substrate, the arc-shaped grooves are formed on the signal line by a half-tone mask and a photolithography pattern process.

In the GOA array substrate, the half-tone mask comprises a non-total light transmission area having various mask penetrating rates.

In the GOA array substrate, a thickness of the insulating layer on the arc-shaped grooves is same as a thickness of the insulating layer on the trunk portion.

In the GOA array substrate, the insulating layer is made of silicon nitride or silicon oxide.

In the GOA array substrate, a material of the first metal layer is same as a material of a gate metal layer of the thin film transistor array layer; and a material of the second metal layer is same as a material of a source/drain metal layer of the thin film transistor array layer.

In the GOA array substrate, the thin film transistor array layer comprises a plurality of scan lines parallel to each other, and the GOA drive circuit is configured to drive the scan lines.

The present disclosure further provides a method for fabricating the aforementioned gate driver on array (GOA) array substrate. The method comprises:

S10: forming a first metal layer on a GOA driving circuit area of a base substrate, wherein the first metal layer has a patterned signal line at a cross-line position of the GOA driving circuit area, and the signal line comprises a trunk portion and side walls formed of two opposite sides of the trunk portion;

S20: etching the side walls by a half-tone mask and a photolithography pattern process to form arc-shaped grooves;

S30: forming an insulating layer on the first metal layer, wherein the insulating layer fills the arc-shaped grooves; and S40: forming a second metal layer on the insulating layer.

In S20 of the method for fabricating the GOA array substrate, the half-tone mask comprises a non-total light transmission area having various mask penetrating rates.

In S30 of the method for fabricating the GOA array substrate, a thickness of the insulating layer on the arc-shaped grooves is same as a thickness of the insulating layer on the trunk portion.

In S30 of the method for fabricating the GOA array substrate, the insulating layer is made of silicon nitride or silicon oxide.

In S10 of the method for fabricating the GOA array substrate, a material of the first metal layer is same as a material of a gate metal layer of the thin film transistor array layer.

In S40 of the method for fabricating the GOA array substrate, a material of the second metal layer is same as a material of a source/drain metal layer of the thin film transistor array layer.

The present disclosure further provides a display device comprising a gate driver on array (GOA) array substrate. The GOA array substrate comprises a base substrate and a GOA driving circuit. The GOA driving circuit is disposed on the base substrate and comprises a plurality of GOA units connected to each other. Each of the GOA units comprises a thin film transistor array layer, a first metal layer disposed on the thin film transistor array layer, an insulating layer disposed on the first metal layer, and a second metal layer disposed on the insulating layer. The first metal layer has a patterned signal line at a position crossing the second metal layer. The signal line comprises a trunk portion and side walls formed of two opposite sides of the trunk portion. The side walls are shaped as arc-shaped grooves.

In the display device, the arc-shaped grooves are formed on the signal line by a half-tone mask and a photolithography pattern process.

In the display device, the half-tone mask comprises a non-total light transmission area having various mask penetrating rates.

In the display device, a thickness of the insulating layer on the arc-shaped grooves is same as a thickness of the insulating layer on the trunk portion.

In the display device, the insulating layer is made of silicon nitride or silicon oxide.

In the display device, a material of the first metal layer is same as a material of a gate metal layer of the thin film transistor array layer; and a material of the second metal layer is same as a material of a source/drain metal layer of the thin film transistor array layer.

In the display device, the thin film transistor array layer comprises a plurality of scan lines parallel to each other, and the GOA drive circuit is configured to drive the scan lines.

In a GOA array substrate, a method for fabricating the same, and a display device comprising the same provided by the present disclosure, a signal line of a patterned first metal layer is designed to have grooves with a certain arc at a position crossing a signal line of a second metal layer, which increase a deposition thickness of an insulating layer at the position, thereby preventing a short circuit between the signal line of the first metal layer and the signal line of the second metal layer and improving stability of a GOA drive circuit in the GOA array substrate.

BRIEF DESCRIPTION OF DRAWINGS

FIG. 1 is a schematic cross-sectional structural diagram of a gate driver on array (GOA) unit of a GOA array substrate at a cross-line position according to an embodiment of the present disclosure.

FIG. 2 is a flowchart of a method for fabricating a GOA array substrate according to an embodiment of the present disclosure.

DETAILED DESCRIPTION

The embodiments provided by the present disclosure can solve the technical problem that, in a current GOA array substrate or in a method for fabricating the same, a first metal layer (M1) and a second metal layer (M2) of a GOA unit are prone to short circuit, triggering overcurrent protection, and then causing a black screen of a display device.

Please refer to FIG. 1, which is a schematic cross-sectional structural diagram of a gate driver on array (GOA) unit of a GOA array substrate at a cross-line position according to an embodiment of the present disclosure. From FIG. 1, components of the embodiment of the present disclosure and a relative positional relationship among the components can be seen intuitively.

Specifically, the GOA array substrate comprises a base substrate 10 and a GOA driving circuit. The GOA driving circuit is disposed on the base substrate 10 and comprises a plurality of GOA units 20 connected to each other. Each of the GOA units 20 comprises a thin film transistor array layer 21, a first metal layer (M1) 22 disposed on the thin film transistor array layer 21, an insulating layer 23 disposed on the first metal layer (M1) 22; and a second metal layer (M2) 24 disposed on the insulating layer 23.

The first metal layer (M1) 22 has a patterned signal line at a position crossing the second metal layer (M2) 24. The signal line comprises a trunk portion 221 and side walls 222 formed of two opposite sides of the trunk portion 221. The side walls 222 are shaped as arc-shaped grooves.

Specifically, the base substrate 10 may be a glass substrate. A material of the glass substrate is uniform and has high transparency, low reflectance, and good thermal stability so that its properties can be kept stable after multiple high-temperature processes. This preferred embodiment does not limit the base substrate 10. When fabricating the GOA array substrate, those skilled in the art can select the base substrate 10 according to specific needs.

Specifically, the thin film transistor array layer 21 comprises a plurality of scan lines (not shown) parallel to each other. The GOA drive circuit is configured to drive the scan lines and drive on or off pixels in a display area of the GOA array substrate.

Specifically, the first metal layer (M1) 22 may be a metal compound conductive layer formed of a plurality of metal layers. The first metal layer (M1) 22 is generally formed by a vapor deposition technique, and then etched to form various signal lines. Further, a material of the first metal layer (M1) 22 is same as a material of a gate metal layer of the thin film transistor array layer.

Furthermore, the arc-shaped grooves are formed on the signal line by a half-tone mask and a photolithography pattern process. The half-tone mask comprises a non-total light transmission area having various mask penetrating rates. A photolithography process of exposing, developing and etching a photoresist material using the half-tone mask makes the first metal layer (M1) 22 to form a patterned signal line at a cross-line position of a GOA bus line area.

Specifically, the insulating layer 23 covers the first metal layer (M1) 22. The insulating layer 23 may comprise one or two layers and may be formed of silicon oxide, silicon nitride, or silicon oxynitride. Preferably, the insulating layer 23 is formed of silicon nitride. A thickness of the insulating layer 23 on the arc-shaped grooves is same as a thickness of the insulating layer 23 on the trunk portion 221.

Specifically, the second metal layer (M2) 24 may be a metal compound conductive layer formed of a plurality of metal layers. The second metal layer (M2) 24 is generally formed by a vapor deposition technique, and then etched to form various signal lines. Further, a material of the second metal layer (M2) 24 is same as a material of a source/drain metal layer of the thin film transistor array layer.

In a GOA array substrate provided by the present disclosure, a signal line of a first metal layer (M1) at a cross-line position in a GOA unit is provided with grooves having a certain arc, which increases a deposition thickness of an insulating layer at the position, thereby effectively preventing a short circuit between the signal line of the first metal layer (M1) and the signal line of the second metal layer (M2), and improving stability of a GOA drive circuit.

Please refer to FIG. 1 and FIG. 2. FIG. 2 is a flowchart of a method for fabricating a GOA array substrate according to an embodiment of the present disclosure. The method comprises the following steps.

S10: forming a first metal layer 22 on a GOA driving circuit area of a base substrate 10, wherein the first metal layer 22 has a patterned signal line at a cross-line position of the GOA driving circuit area, and the signal line comprises a trunk portion 221 and side walls 222 formed of two opposite sides of the trunk portion;

Specifically, S10 further comprises the following steps.

First, a base substrate 10 is provided. The base substrate 10 is provided with a thin film transistor array layer 21. The thin film transistor array layer 21 comprises a plurality of scan lines (not shown) parallel to each other. Then, a first metal layer (M1) 22 is deposited on a GOA driving circuit area of the base substrate 10. The first metal layer (M1) 22 is disposed on the thin film transistor array layer 21. The first metal layer (M1) 22 may be a metal compound conductive layer formed of a plurality of metal layers. The first metal layer (M1) 22 is etched to form various signal lines. Further, a material of the first metal layer (M1) 22 is same as a material of a gate metal layer of the thin film transistor array layer.

S20: etching the side walls 222 by a half-tone mask and a photolithography pattern process to form arc-shaped grooves.

Specifically, S20 further comprises the following steps.

First, the side walls 222 are etched by a half-tone mask and a photolithography pattern process to form arc-shaped grooves. The arc-shaped grooves are formed on the signal line by a half-tone mask and a photolithography pattern process. The half-tone mask comprises a non-total light transmission area having various mask penetrating rates. Furthermore, a photolithography process of exposing, developing and etching a photoresist material using the half-tone mask makes the first metal layer (M1) 22 to form a patterned signal line at a cross-line position of a GOA bus line area.

S30: forming an insulating layer 23 on the first metal layer 22, wherein the insulating layer 23 fills the arc-shaped grooves.

Specifically, S30 further comprises the following steps.

An insulating layer 23 is formed on the first metal layer 22 by plasma enhanced chemical vapor deposition (PECVD). The insulating layer 23 fills the arc-shaped grooves. The insulating layer 23 may comprise one or two layers, and may be formed of silicon oxide, silicon nitride, or silicon oxynitride. Preferably, the insulating layer 23 is formed of silicon nitride. A thickness of the insulating layer 23 on the arc-shaped grooves is same as a thickness of the insulating layer 23 on the trunk portion 221.

S40: forming a second metal layer 24 on the insulating layer 23.

Specifically, S40 further comprises the following steps.

A second metal layer (M2) 24 is deposited on the insulating layer 23 by physical vapor deposition (PVD). The second metal layer (M2) 24 may be a metal compound conductive layer formed of a plurality of metal layers. The second metal layer (M2) 24 is etched to form various signal lines. Further, a material of the second metal layer (M2) 24 is same as a material of a source/drain metal layer of the thin film transistor array layer. The thin film transistor array layer 21, the first metal layer (M1) 22, the insulating layer 23, and the second metal layer (M2) 24 form GOA units 20 in the GOA driving circuit. The GOA units 20 are configured to drive the scan lines of the thin film transistor array layer 21 and drive on or off pixels in a display area of the GOA array substrate.

The present disclosure further provides a display device comprising the aforementioned gate driver on array (GOA) array substrate. The specific implementation of the GOA array substrate can refer to the previous embodiments, and will not be described herein.

In the above, a GOA array substrate, a method for fabricating the same, and a display device comprising the same provided by the present disclosure, a signal line of a patterned first metal layer is designed to have grooves with a certain arc at a position crossing a signal line of a second metal layer, which increase a deposition thickness of an insulating layer at the position, thereby preventing a short circuit between the signal line of the first metal layer and the signal line of the second metal layer and improving stability of a GOA drive circuit in the GOA array substrate.

It should be understood that those skilled in the art may make equivalent replacements or changes based on the technical solutions and inventive concepts of the present application, and all such changes or replacements shall fall within the scope of the claims of the present application.

What is claimed is:

1. A gate driver on array (GOA) array substrate, comprising:
   a base substrate;
   a thin film transistor array layer disposed on the base substrate;
   a first metal layer disposed on the thin film transistor array layer and comprising a first signal line;
   an insulating layer covering the first signal line; and
   a second metal layer disposed on the insulating layer and comprising a second signal line;
   wherein the first signal line extends across the second signal line, and the insulating layer is disposed between the first signal line and the second signal line,
   the first signal line comprises a trunk portion and two side walls formed of two opposite sides of the trunk portion, and the two side walls are shaped as arc-shaped grooves, and each of the two side walls of the first signal line is shaped as an arc-shaped groove,
   the second signal line comprises a horizontal portion opposite to the trunk portion of the first signal line, and two inclined portions located at two opposite sides of the horizontal portion and opposite to the two side walls of the first signal line respectively,
   a thickness of a part of the insulating layer between the horizontal portion and the trunk portion is same as a thickness of a part of the insulating layer between each of the two side walls and a corresponding inclined portion of the second signal line, and
   the thin film transistor array layer, the first metal layer, the insulating layer, and the second metal layer form a GOA unit.

2. The GOA array substrate according to claim 1, wherein the arc-shaped grooves are formed by a half-tone mask and a photolithography pattern process.

3. The GOA array substrate according to claim 2, wherein the half-tone mask comprises a non-total light transmission area having various mask penetrating rates.

4. The GOA array substrate according to claim 1, wherein the insulating layer is made of silicon nitride or silicon oxide.

5. The GOA array substrate according to claim 1, wherein the thin film transistor array layer comprises a plurality of scan lines parallel to each other, and a GOA drive circuit comprising the GOA unit is configured to drive the scan lines.

6. A display device, comprising a gate driver on array (GOA) array substrate, wherein the GOA array substrate comprises:
- a base substrate;
- a thin film transistor array layer disposed on the base substrate;
- a first metal layer disposed on the thin film transistor array layer and comprising a first signal line;
- an insulating layer covering the first signal line; and
- a second metal layer disposed on the insulating layer and comprising a second signal line;
- wherein the first signal line extends across the second signal line, and the insulating layer is disposed between the first signal line and the second signal line,
- the first signal line comprises a trunk portion and two side walls formed of two opposite sides of the trunk portion, and the two side walls are shaped as arc-shaped grooves, and each of the two side walls of the first signal line is shaped as an arc-shaped groove
- the second signal line comprises a horizontal portion opposite to the trunk portion of the first signal line, and two inclined portions located at two opposite sides of the horizontal portion and opposite to the two side walls of the first signal line respectively,
- a thickness of a part of the insulating layer between the horizontal portion and the trunk portion is same as a thickness of a part of the insulating layer between each of the two side walls and a corresponding inclined portion of the second signal line, and
- the thin film transistor array layer, the first metal layer, the insulating layer, and the second metal layer form a GOA unit.

7. The display device according to claim 6, wherein the arc-shaped grooves are formed by a half-tone mask and a photolithography pattern process.

8. The display device according to claim 7, wherein the half-tone mask comprises a non-total light transmission area having various mask penetrating rates.

9. The display device according to claim 6, wherein the insulating layer is made of silicon nitride or silicon oxide.

10. The display device according to claim 6, wherein the thin film transistor array layer comprises a plurality of scan lines parallel to each other, and a GOA drive circuit comprising the GOA unit is configured to drive the scan lines.

11. A method for fabricating a gate driver on array (GOA) array substrate, comprising:
- S10: forming a thin film transistor array layer on a base substrate, and forming a first metal layer on the thin film transistor array layer, wherein the first metal layer comprises a first signal line;
- S20: etching two opposite side walls of a part of the first signal line by a half-tone mask and a photolithography pattern process to form arc-shaped grooves;
- S30: forming an insulating layer covering the first signal line;
- S40: forming a second metal layer on the insulating layer, wherein the second metal layer comprises a second signal line extending across the first signal line,
- wherein the first signal line comprises a trunk portion and two side walls formed of two opposite sides of the trunk portion, and the two side walls are shaped as arc-shaped grooves, and each of the two side walls of the first signal line is shaped as an arc-shaped groove,
- the second signal line comprises a horizontal portion opposite to the trunk portion of the first signal line, and two inclined portions located at two opposite sides of the horizontal portion and opposite to the two side walls of the first signal line respectively,
- a thickness of a part of the insulating layer between the horizontal portion and the trunk portion is same as a thickness of a part of the insulating layer between each of the two side walls and a corresponding inclined portion of the second signal line, and
- the thin film transistor array layer, the first metal layer, the insulating layer, and the second metal layer form a GOA unit.

12. The method for fabricating the GOA array substrate according to claim 11, wherein, in S20, the half-tone mask comprises a non-total light transmission area having various mask penetrating rates.

13. The method for fabricating the GOA array substrate according to claim 11, wherein, in S30, the insulating layer is made of silicon nitride or silicon oxide.

* * * * *